United States Patent [19]

Okumura

[11] Patent Number: 5,159,214

[45] Date of Patent: Oct. 27, 1992

[54] BICMOS LOGIC CIRCUIT

[75] Inventor: Koichiro Okumura, Tokyo, Japan

[73] Assignee: NEC Corporation, Tokyo, Japan

[21] Appl. No.: 752,071

[22] Filed: Aug. 29, 1991

[30] Foreign Application Priority Data

Aug. 29, 1990 [JP] Japan .................. 2-228687
Aug. 29, 1990 [JP] Japan .................. 2-228691

[51] Int. Cl.⁵ .......................................... H03K 19/01
[52] U.S. Cl. .................... 307/446; 307/443; 307/570
[58] Field of Search ................... 307/443, 446, 570

[56] References Cited

U.S. PATENT DOCUMENTS

| | | | |
|---|---|---|---|
| 4,649,295 | 3/1987 | McLaughlin et al. | 307/570 |
| 4,733,110 | 3/1988 | Hara et al. | 307/443 |
| 4,769,561 | 9/1988 | Iwamura et al. | 307/446 |
| 4,779,014 | 10/1988 | Masuoka et al. | 307/570 |
| 4,808,850 | 2/1989 | Masuda et al. | 307/446 |
| 5,057,713 | 10/1991 | Iwamura et al. | 307/446 |

Primary Examiner—Edward P. Westin
Assistant Examiner—Benjamin D. Driscoll

[57] ABSTRACT

A BiCMOS logic circuit, in one arrangement, includes an NPN bipolar transistor and a first NMOS connected in series. It also includes a CMOS logic circuit, an NMOS logic section, a PMOS and a second NMOS. The CMOS logic circuit conducts logical operation on input signals. The NPN bipolar transistor driven by a signal from the CMOS logic circuit has a base connected to the CMOS logic circuit, a collector connected to a power source and an emitter connected to an output terminal. The first NMOS has a drain connected to the output terminal and a source connected to ground. The NMOS logic section is connected between the power source and a gate of the first NMOS. The PMOS is connected in parallel with the NMOS logic section and receives at its gate the signal from the CMOS logic circuit, and the second NMOS is connected between the gate of the first NMOS and the ground and receives at its gate the signal from the CMOS logic circuit. In another similar arrangement, two NPN bipolar transistors are connected in series. The BiCMOS logic circuit thus arranged is capable of operating at a high speed under low power supply voltages.

4 Claims, 7 Drawing Sheets

BICMOS LOGIC CIRCUIT

BACKGROUND OF THE INVENTION

The present invention relates to a Bipolar-CMOS (BiCMOS) logic circuit and, more particularly, to a BiCMOS logic circuit which is suitable for operation under low power supply voltage.

In recent years, with advancement in speed of operation of integrated circuits, the demand for BiCMOS logic circuits is increasing. In one type of BiCMOS logic circuit which is recently attracting attention, there are an NPN bipolar transistor and N-channel MOSFETs (hereinafter referred to as "NMOSs") which are connected with each other in series and have an output terminal disposed between them. In another type of a typical conventional BiCMOS logic circuit, a similar arrangement includes two NPN bipolar transistors which are connected with each other in series. Generally, an advantage of BiCMOS logic circuits resides in their ability to drive a large load capacitance. However, in both the types of conventional BiCMOS logic circuits, there is a problem or disadvantage in that their operation speed under low power supply voltage is low. Full description of such conventional BiCMOS logic circuits and the problems existing therein will be fully explained later.

SUMMARY OF THE INVENTION

An object of the present invention is to provide a BiCMOS logic circuit which is capable of operating at a high speed under low power supply voltage.

Another object of the invention is to provide a BiCMOS logic circuit in which it is possible to decrease the size of an NMOS logic unit, to reduce input capacitance and to decrease fan-out dependency on average delay times.

According to one aspect of the invention, there is provided a BiCMOS logic circuit comprising:

a higher potential and a lower potential power supply terminal;

a CMOS logic circuit for conducting a logical operation on input signals applied thereto;

an NPN bipolar transistor having a base connected to the CMOS logic circuit, a collector connected to the higher potential power supply terminal and an emitter connected to an output terminal, the NPN bipolar transistor being driven by an output signal from the CMOS logic circuit;

a first N-channel MOSFET having a drain connected to the output terminal and a source connected to the lower potential power supply terminal;

an N-channel MOS logic section connected between the higher potential power supply terminal and a gate of the first N-channel MOSFET and having the same circuit configuration and receiving the same input signals as the N-channel MOSFETs included in the CMOS logic circuit;

a P-channel MOSFET connected in parallel with the N-channel MOS logic section and receiving at its gate the output signal from the CMOS logic circuit; and a second N-channel MOSFET connected between the gate of the first N-channel MOSFET and the lower potential power supply terminal and receiving at its gate the output signal from the CMOS logic circuit.

According to another aspect of the invention, there is provided a BiCOS logic circuit comprising:

a higher potential and a lower potential power supply terminal;

a CMOS logic circuit for conducting a logical operation on input signals applied thereto;

a first NPN bipolar transistor having a base connected to the CMOS logic circuit, a collector connected to the higher potential power supply terminal and an emitter connected to an output terminal, the first NPN bipolar transistor being driven by an output signal from the CMOS logic circuit;

a second NPN bipolar transistor having a collector connected to the output terminal and an emitter connected to the lower potential power supply terminal;

an N-channel MOS logic section connected between the output terminal and a base of the second NPN bipolar transistor and having the same circuit configuration and receiving the same input signals as the N-channel MOSFETs included in the CMOS logic circuit;

a P-channel MOSFET connected in parallel with the N-channel MOS logic section and receiving at its gate the output signal from the CMOS logic circuit; and an N-channel MOSFET connected between the base of the second NPN bipolar transistor and the lower potential power supply terminal and receiving at its gate the output signal from the CMOS logic circuit.

BRIEF DESCRIPTION OF THE DRAWINGS

The above and other objects, features and advantages of the present invention will be apparent from the following description of preferred embodiments of the invention explained with reference to the accompanying drawings, in which:-

PREFERRED EMBODIMENTS OF THE INVENTION

Throughout the following explanation, similar reference symbols or numerals refer to the same or similar elements in all the figures of the drawings.

First, the invention is described with respect to embodiments wherein the BiCMOS logic circuit includes an NPN bipolar transistor and an N-channel MOSFET (hereinafter referred to as "NMOS") which are connected with each other in series with an intermediate point between them being made an output terminal.

For the purpose of assisting in the understanding of the present invention, a conventional BiCMOS logic circuit relevant to the embodiments of the invention is explained.

Figure 1:
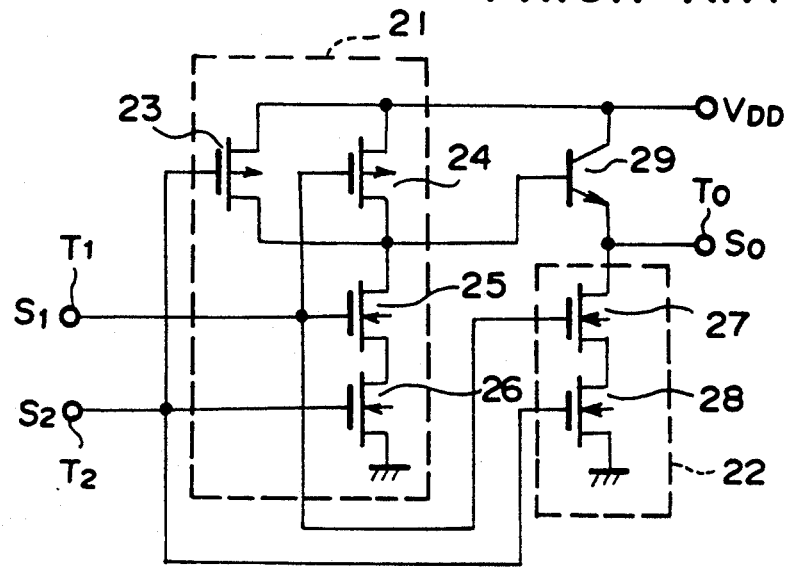
FIG. 1 is a circuit diagram showing a conventional BiCMOS logic circuit.

FIG. 1 diagrammatically shows such a conventional BiCMOS logic circuit which is designed for use under low power supply voltage and which includes the NPN bipolar transistor and the NMOSs connected in series.

In FIG. 1, a CMOS logic circuit 21 conducts a logical NAND operation between input signals $S_1$ and $S_2$ applied to input terminals $T_1$ and $T_2$, respectively. The CMOS logic circuit 21 is formed such that a parallel circuit of P-channel MOSFETs (hereinafter referred to as "PMOSs") 23, 24 and a serial circuit of NMOSs 25, 26 are connected in series between a power source terminal $V_{DD}$ and a ground terminal. The input signal $S_1$ applied to the input terminal $T_1$ is inputted to gates of the PMOS 24 and the NMOS 25, and the input signal $S_2$ applied to the input terminal $T_2$ is inputted to gates of the PMOS 23 and the NMOS 26. A connection between common drains of the PMOSs 23, 24 and a drain of the NMOS 25 is an output node of the CMOS logic circuit 21. This output node is connected to a base of an NPN bipolar transistor 29 whose collector is connected to the power source terminal $V_{DD}$ and whose emitter is connected to an output terminal $T_o$ for outputting an output signal $S_o$. Connected between the emitter of the NPN bipolar transistor 29 and the ground terminal is an NMOS logic section 22 formed by a serial circuit of the NMOSs 27 and 28 to which the input signals $S_1$ and $S_2$ are respectively inputted.

In the circuit as arranged above, assuming that both the input signals $S_1$ and $S_2$ are "1", the output signal $S_o$ will be in its "0" state. When this state changes to a state wherein at least either of the input signals $S_1$ and $S_2$ is "0", at least one of the PMOSs 23 and 24 becomes conductive and at least one of the NMOSs 25 and 26 becomes non-conductive, so that the potential at the output node of the CMOS logic circuit 21 rises towards the potential of the power source voltage $V_{DD}$ and accordingly the NPN bipolar transistor 29 becomes conductive due to the rise of its base potential. On the other hand, since one of the NMOSs 27 and 28 becomes non-conductive, the NMOS logic section 22 loses its current passage. As a result, the potential of the output signal $S_o$ rises and reaches the potential which is lowered from the $V_{DD}$ potential by the amount of the built-in potential $V_F$ of the emitter-base junction of the NPN bipolar transistor 29. Thus, the level of the potential of the output signal $S_o$ becomes "1".

In contrast to the above, when the state wherein either of the input signals $S_1$ and $S_2$ is "0" changes to a state wherein both the input signals are "1", the PMOSs 23 and 24 become non-conductive and the NMOSs 25 and 26 become conductive, so that the potential level at the output node of the CMOS logic circuit 21 becomes "0". As a result, the NPN bipolar transistor 29 becomes non-conductive. On the other hand, since both the NMOSs 27 and 28 become conductive, the NMOS logic section 22 will have a current passage therethrough and, as a result, the potential of the output signal $S_o$ falls towards the ground potential and reaches its "0" level.

Generally, the BiCMOS logic circuit is used in a section which requires a high speed driving of a large load capacitance. The conventional circuit explained above has no problem in so far as the charging of a large load capacitance applied to the output terminal is concerned due to the operation of the NPN bipolar transistor 29 which has a large driving capability. However, when discharging the charge load capacitance, it is necessary to do so through the NMOSs which have inherently a small driving capability. This means that it is necessary for the driving capability of the NMOS logic section to be elevated to the extent comparable to that of the NPN bipolar transistor 29. In order to meet this necessity, it is required that the channel width of each of the NMOSs 27 and 28 be set substantially large.

Therefore, in the conventional BiCMOS logic circuit explained above, the NMOSs for discharging purposes must of necessity be of large size and, as a result, the input capacitance inevitably becomes very large. This presents a problem in that, as the input capacitance increases, there is an increase in the number of fan-outs resulting in a marked increase in the average delay times Tpd.

The BiCMOS logic circuit exemplified in FIG. 1 shows that of a two-input NAND gate type. However, where the number of inputs increases, there will be an increase in the number of stages in series of the NMOSs forming the discharging passage. Thus, it is required that the sizes of the NMOSs be further increased for them to be able to operate at a high speed. In effect, the input capacitance is further increased and the fan-out dependency on Tpd is shown to have an acute increase and these are accounted for as elements for capability limitations of circuits in practical use.

The present invention thus aims at providing a BiCMOS logic circuit which overcomes the above explained problems and in which the input capacitance can be decreased and the fan-out dependency on the average delay times can be restricted.

In the BiCMOS logic circuit according to the present invention, when NMOSs included in a CMOS logic circuit become conductive and the output of the CMOS logic circuit rises, an NMOS logic section first becomes conductive and charges a gate of a first NMOS through the NMOS logic section. Subsequently, the gate of the first NMOS is charged through a PMOS. Thus, it is possible to shorten the time at which the first NMOS is caused to start being in a conductive state by the NMOS logic section and also to enhance the gate driving capability of the first NMOS by the PMOS.

According to the present invention, the amount which is to be charged through the NMOS logic section is only for the gate capacitance of the first NMOS and, moreover, it is sufficient if the NMOS logic section operates only for initial charging, so that the ON-resistance of the NMOS logic section can be of a large value. Therefore, in the BiCMOS according to the invention, the size of the NMOS logic section can be made small and also the input capacitance can be made smaller as compared with that in the conventional circuit.

Now, some embodiments according to the invention are explained.

Figure 3:
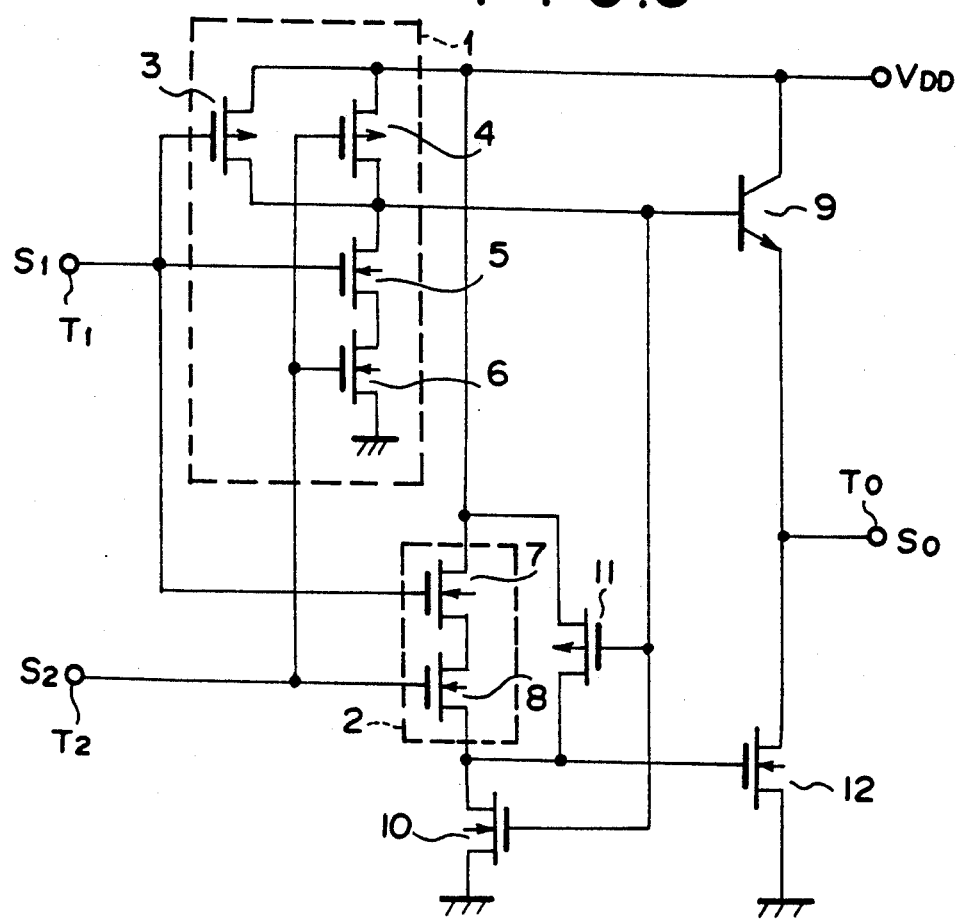
FIG. 3 is a circuit diagram showing a BiCMOS logic circuit of a first embodiment according to the present invention.

FIG. 3 diagrammatically shows a two-input NAND type BiCMOS logic circuit which is designed for the operation under low power supply voltage and which includes an NPN bipolar transistor and an NMOS connected to each other in series.

A CMOS logic circuit 1 is one from which a logical NAND signal of input signals $S_1$ and $S_2$ is outputted and in which a parallel circuit of PMOSs 3, 4 and a serial circuit of NMOSs 5, 6 are connected in series between a power source terminal $V_{DD}$ and a ground terminal. The input signal $S_1$ is inputted to gates of the PMOS 3 and the NMOS 5 and the input signal $S_2$ is inputted to gates of the PMOS 4 and NMOS 6. A connection node between common drains of the PMOSs 3, 4 and a drain of the NMOS 5 is an output node of the CMOS logic circuit 1.

The output node of the CMOS logic circuit 1 is connected to a base of an NPN bipolar transistor 9. The NPN bipolar transistor 9 has its collector connected to the power source terminal $V_{DD}$ and its emitter connected to an output terminal $T_0$ for an output signal $S_0$. An NMOS 12 is connected between the emitter of the NPN bipolar transistor 9 and the ground terminal.

Between the power source terminal $V_{DD}$ and the gate of the NMOS 12, there are the NMOS logic section 2 formed by NMOSs 7, 8 and a PMOS 11 which is connected therewith in parallel. The input signals $S_1$ and $S_2$ are respectively inputted to the gates of the NMOSs 7 and 8. The gate of the PMOS 11 is connected to the base of the NPN bipolar transistor 9. Further, between the gate of the NMOS 12 and the ground terminal, there is connected an NMOS 10 whose gate is connected to the base of the NPN bipolar transistor 9.

The NMOS logic section 2 and the NMOS 10 constitute a partial circuit of the two-input AND logic circuit. Consequently, there occurs a push-pull operation between the NPN bipolar transistor 9 whose base is connected to the output node of the CMOS logic circuit 1 and the NMOS 12 whose gate is connected to the output node of the circuit constituted by the NMOS logic section 2 and the NMOS 10. The PMOS 11 charges the gate of the NMOS 12 up to the $V_{DD}$ potential and operates to enhance the driving capability of the NMOS 12.

Now, the operation of the circuit described above is explained with reference to FIG. 3.

In the state in which both the input signals $S_1$ and $S_2$ are "1", the PMOSs 3, 4 are non-conductive and the NMOSs 5, 6 are conductive, so that the output node of the CMOS logic circuit 1 becomes "0" level. Since the NPN bipolar transistor 9 and the NMOS 10 become non-conductive and the NMOS logic section 2 and the NMOS 12 become conductive, the output signal $S_0$ turns to its "0" level. When this state changes to a state wherein at least either of the input signals $S_1$ and $S_2$ is "0", at least one of the PMOSs 3 and 4 becomes conductive and at least one of the NMOSs 5 and 6 becomes non-conductive, so that the potential at the output node of the CMOS logic circuit 1 rises from the ground potential towards the potential of the power source voltage $V_{DD}$. When the potential difference between the base and the emitter of the NPN bipolar transistor 9 exceeds the built-in potential $V_F$ thereof, the NPN bipolar transistor 9 becomes conductive. On the other hand, when at least either of the input signals $S_1$ and $S_2$ becomes "0", since one of the NMOSs 7 and 8 becomes non-conductive, a current passage of the NMOS logic section 2 is cut-off. Also, since both the gates of the NMOS 10 and the PMOS 11 are connected to the output node of the CMOS logic circuit 1, the NMOS 10 becomes conductive and the PMOS 11 becomes non-conductive. Thus, the gate potential of the NMOS 12 falls towards the ground level and the NMOS 12 becomes non-conductive. As a result, the potential of the output signal $S_0$ at the output terminal $T_0$ rises towards the value in which the amount of $V_F$ is subtracted from the $V_{DD}$ potential. Thus, the potential level of the output signal $S_0$ becomes "1".

In contrast to the above, when the state wherein either of the input signals $S_1$ and $S_2$ is "0" changes to a state wherein both the input signals are "1", the potential of the output node of the CMOS logic circuit 1 falls towards the ground potential and the NPN bipolar transistor 9 becomes non-conductive. On the other hand, since both the NMOSs 7 and 8 become conductive, the NMOS logic section 2 will have a current passage therethrough. First, the gate potential of the NMOS 12 rises to the value which is determined by the resistance ratio of the time when the NMOS logic section 2 and the NMOS 10 become conductive and this causes the NMOS 12 to be in a slightly conductive state. Next, since the NMOS 10 turns to its non-conductive state and the PMOS 10 turns to its conductive state, as the potential of the output node of the CMOS logic circuit 1 is lowered, the gate potential of the NMOS 12 quickly rises towards the potential of the power source voltage $V_{DD}$ thereby causing the NMOS 12 to be in a deeply conductive state and, as a result, the potential of the output terminal $T_0$ falls quickly towards the ground potential resulting in the potential being in its "0" level.

Thus, according to the present embodiment of the invention, when both the input signals $S_1$ and $S_2$ undergo changes, the gate of the NMOS 12 is charged first through the NMOS logic section 2 and later through the PMOS 11. If the PMOS 11 is not present, the gate of the NMOS 12 will have to be charged solely by the NMOS logic section 2 so that the gate potential thereof will rise only to the potential in which the value is lowered from the high levels of the input signals $S_1$, $S_2$ by the threshold voltage $V_{TN}$ of the NMOSs and this means that the driving capability of the NMOS 12 will be lowered. Further, if the NMOS logic section 2 is not present, the potential change in the CMOS logic circuit 1 will be supplied to the gate of the NMOS 12 after being further inverted by a CMOS inverter constituted by the PMOS 11 and the NMOS 10, the time required before the start of the conduction of the NMOS 12 will be longer. According to the embodiment of the invention, however, since the NMOS logic section 2 and the PMOS 11 are both present, it is possible to expedite the start of the conduction of the NMOS 12 and also to maintain the driving capability at a high level.

As to the second object of the invention, which is to decrease the input capacitance, since the subject to be charged through the NMOS logic section 2 is the gate capacitance of the NMOS 12 and, moreover, only the initial charging thereby is sufficient, the ON-resistance at the time of the conduction of the NMOSs 7 and 8 constituting the NMOS logic section 2 can be several times greater in its value than that in the NMOSs 27, 28 of the conventional circuit shown in FIG. 1.

Therefore, according to the present invention, the NMOSs 7 and 8 can be made small in size, thereby realizing a BiCMOS circuit having a small input capacitance as compared with the conventional circuit.

Figure 4:
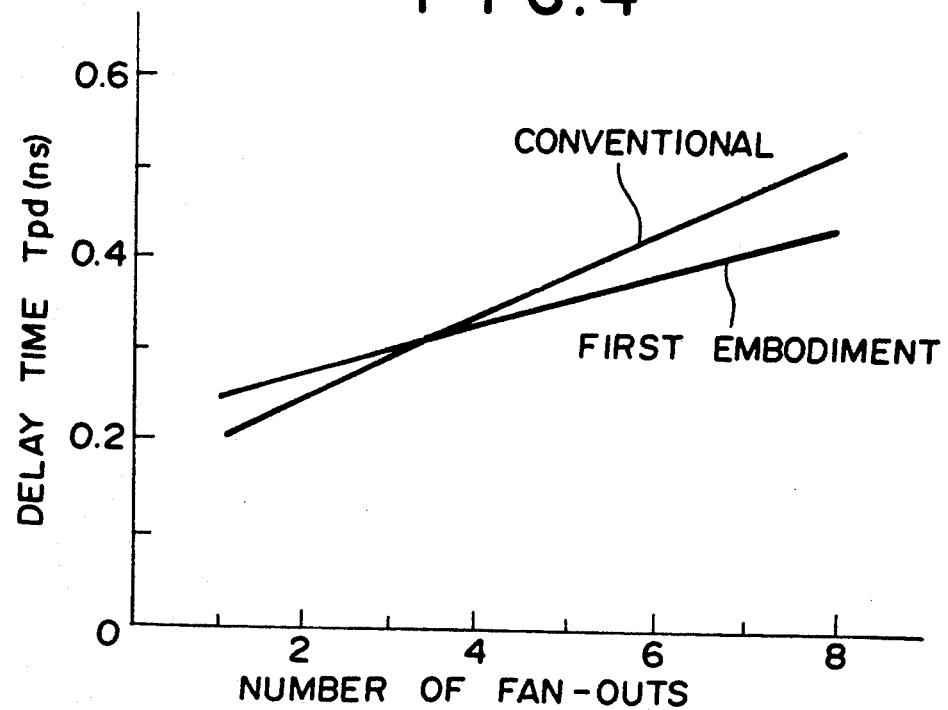
FIG. 4 is a graph showing a relationship between the number of fan-outs and the delay times in the circuit shown in FIG. 3 compared with those in the prior art.

FIG. 4 graphically shows a relationship between the number of fan-outs and the delay times Tpd of the circuit according to the present embodiment. As apparent from the graph, it is due to the input capacitance reduction effect that, despite an increase in the number of fan-outs, the ratio of an increase in the Tpd is small in the embodiment of the invention. It can be appreciated that the operation at a higher speed is enabled when the number of fan-outs is larger as compared with the conventional circuit.

Figure 5:
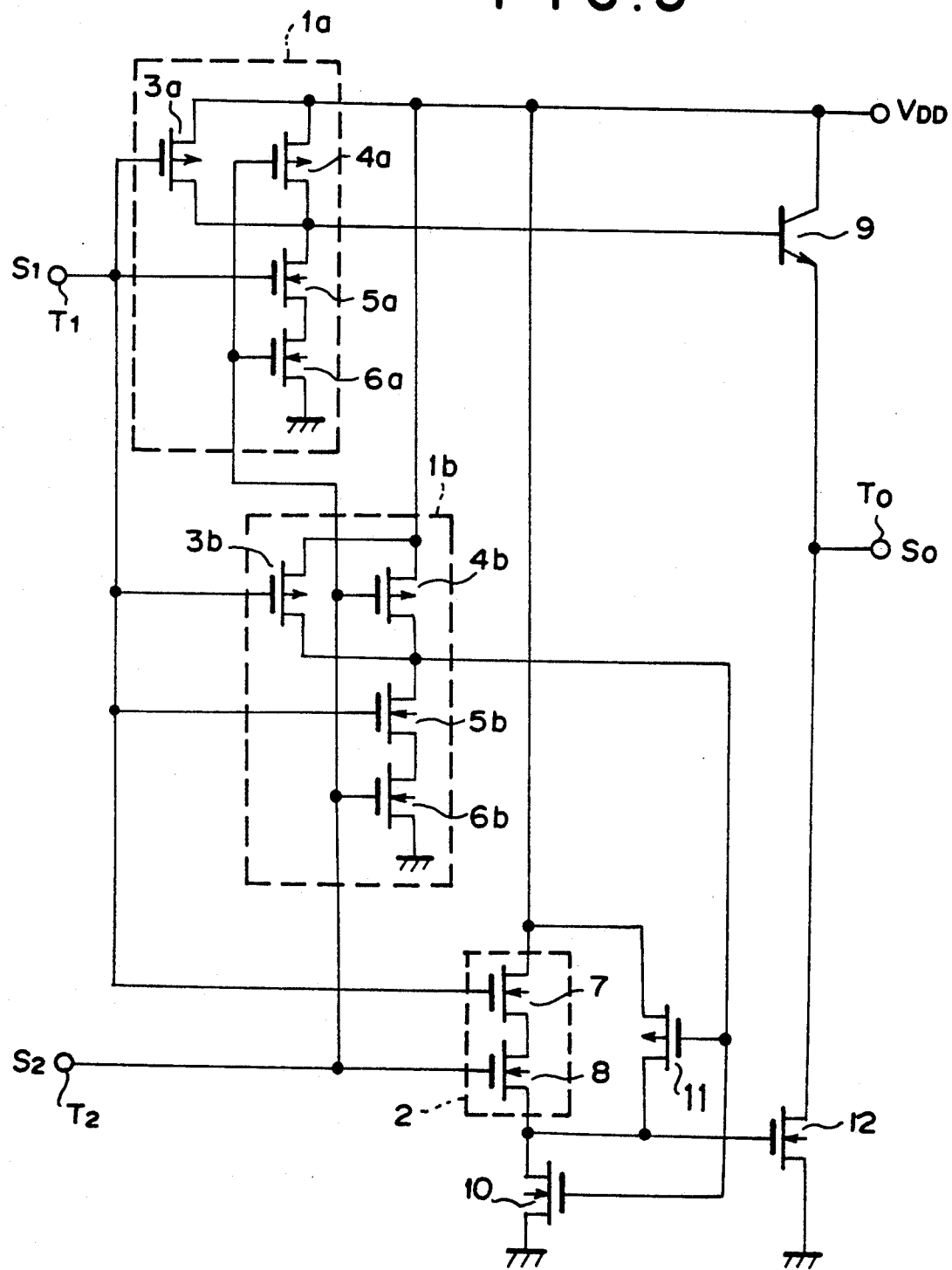
FIG. 5 is a circuit diagram showing a BiCMOS logic circuit of a second embodiment according to the present invention.

The second embodiment of the present invention will be now explained with reference to FIG. 5.

A BiCMOS circuit according to this embodiment includes a first CMOS logic circuit 1a formed by a pair of PMOSs 3a, 4a and a pair of NMOSs 5a, 6a and a second CMOS circuit 1b similarly formed by a pair of PMOSs 3b, 4b and a pair of NMOSs 5b, 6b, and these circuits constitute the same two-input NAND circuit.

The differences between this embodiment and the first embodiment reside in that in the first embodiment, the NPN bipolar transistor 9 and the NMOS 10 and the PMOS 11 are driven by the CMOS logic circuit 1, and in the second embodiment, the first CMOS logic circuit 1a is provided exclusively for driving the base of the NPN bipolar transistor 9 and the second CMOS logic circuit 1b is provided exclusively for driving the gates of the NMOS 10 and the PMOS 11. In other respects, the configuration and operation as explained with reference to FIG. 3 are the same in the embodiment of FIG. 5.

In this embodiment, it has been made possible to speed up the operation of the circuit because the output load capacitance to be driven by the first CMOS logic circuit 1a is the base capacitance of the NPN bipolar transistor 9 and also the output load capacitance to be driven by the second CMOS logic circuit 1b is only the capacitance of the gates of the NMOS 10 and the PMOS 11.

Further, unlike in the first embodiment, the NMOSs 5a, 6a of the first CMOS logic circuit 1a are used exclusively for discharging the charge at the base of the NPN bipolar transistor 9 which makes it unnecessary to reduce the ON-resistance of the transistor 9 and which allows the use of an NMOS of a small size. Similarly, since the PMOSs 3b, 4b of the second CMOS logic circuit 1b are also exclusively for making the NMOS 10 conductive and discharging the charge at the gate of the NMOS 12, it is possible to use the PMOSs of a smaller size as compared with the PMOSs 3a, 4a of the first CMOS logic circuit 1a. Therefore, there is an advantage in this embodiment as compared with the first embodiment in that the circuit can operate at a higher speed and that the input capacitance can be suppressed to a smaller increase.

The above explained embodiments exemplified only the two-input NAND circuits. However, it is of course possible for the present invention to be embodied in other types of logic circuits. As can be readily appreciated from the above explanation, the present invention can be advantageously applied especially to various logic circuits of multi-input NAND types.

So far the explanation has been made in respect of one aspect of the invention wherein the BiCMOS logic circuit includes the NMOS connected in series with the NPN bipolar transistor.

Now, the invention will be explained for the embodiments in which the BiCMOS logic circuit includes two NPN bipolar transistors connected with each other in series and having an output terminal therebetween.

However, for the purpose of assisting in the understanding of the invention, a conventional BiCMOS logic circuit of the type relevant to the embodiments will first be explained.

Figure 2:
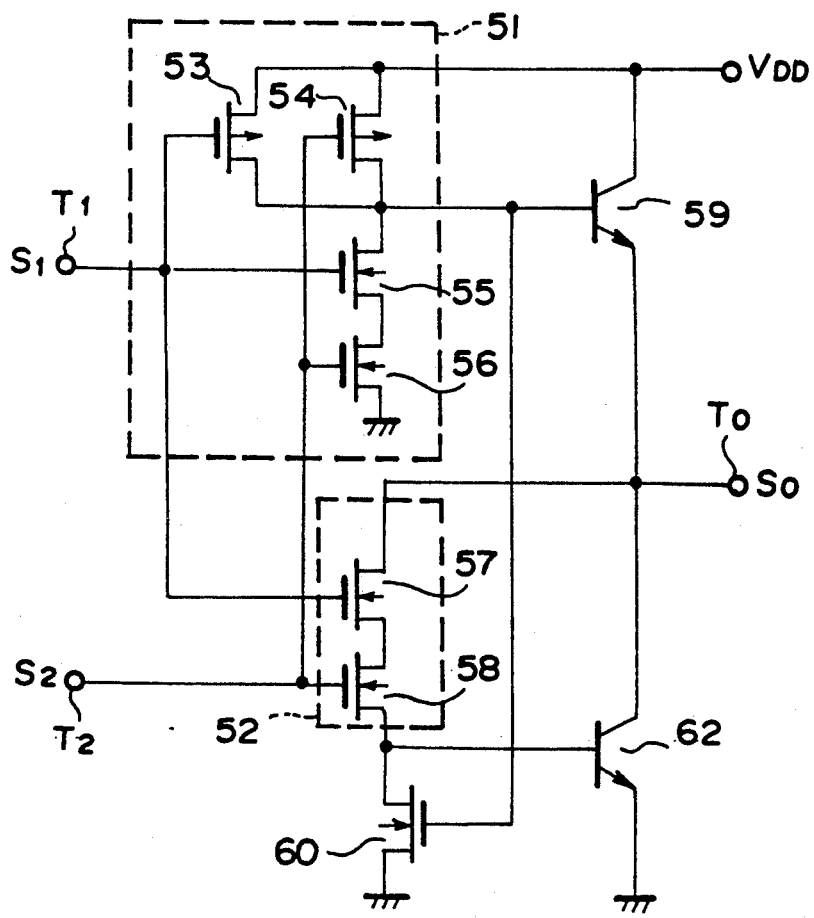
FIG. 2 is a circuit diagram showing another conventional BiCMOS logic circuit.

FIG. 2 diagrammatically shows such a conventional BiCMOS logic circuit. In FIG. 2, a CMOS logic circuit 51 conducts a logical NAND operation between input signals $S_1$ and $S_2$. The CMOS logic circuit is constructed such that a parallel circuit of a pair of PMOSs 53, 54 and a serial circuit of NMOSs 55, 56 are connected in series between a power source terminal $V_{DD}$ and a ground terminal. The input signal $S_1$ is inputted to gates of the PMOS 53 and the NMOS 55 and the input signals $S_2$ is inputted to gates of the PMOS 54 and the NMOS 56. A connection between common drains of the PMOSs 53, 54 and a drain of the NMOS 55 is an output node of the CMOS logic circuit 51. This output node is connected to a base of an NPN bipolar transistor 59.

The NPN bipolar transistor 59 has its collector connected to the power source terminal $V_{DD}$ and its emitter connected to an output terminal $T_o$ for an output signal $S_o$. Between the emitter of the NPN bipolar transistor 59 and the ground terminal, there is an NPN bipolar transistor 62.

Between the output terminal $T_o$ for the output signal $S_o$ and the base of the NPN bipolar transistor 62, there is connected an NMOS logic section 52 formed by a serial circuit of NMOSs 57 and 58 to which the input signals $S_1$ and $S_2$ are respectively inputted. Further, between the base of the NPN bipolar transistor 62 and the ground terminal, there is connected an NMOS 60 whose gate is connected to the output node of the CMOS logic circuit 51.

In the above circuit, the NMOS logic section 52 and the NMOS 60 produce an output whose phase is opposite to that of the CMOS logic circuit 51 whereby the NPN bipolar transistors 59 and 62 perform a push-pull operation.

In the operation of the circuit of FIG. 2, when both the input signals $S_1$ and $S_2$ are "1", the output signal $S_o$ will be in its "0" state. When this state changes to a state wherein at least either of the input signals $S_1$ and $S_2$ is "0", at least one of the PMOSs 53 and 54 becomes conductive and at least one of the NMOSs 55 and 56 becomes non-conductive, so that the output node of the CMOS logic circuit 51, that is the base potential of the NPN bipolar transistor 59, rises towards the potential of the power source voltage $V_{DD}$ as a result of being charged by at least one of the PMOSs 53 and 54. Consequently, the NPN bipolar transistor 59 becomes conductive.

On the other hand, in the NMOS logic section 52, one of the NMOSs 57 and 58 becomes non-conductive. The NMOS 60 becomes conductive. As a result, the base potential of the NPN bipolar transistor 62 falls towards the ground potential thereby causing the NPN bipolar transistor 62 to become non-conductive. As a result, the potential of the output signal $S_o$ rapidly rises and reaches a potential which is lower than the $V_{DD}$ potential by the amount of the built-in potential $V_F$ of the emitter-base junction of the NPN bipolar transistor 59. Thus, the level of the potential of the output signal $S_o$ becomes "1".

In contrast to the above, when the state wherein either of the input signals $S_1$ and $S_2$ is "0" changes to a state wherein both the input signals are "1", the PMOSs 53, 54 become non-conductive and the NMOSs 55, 56 become conductive, so that the output node of the CMOS logic circuit 51, that is, the base potential of the NPN bipolar transistor 59, falls towards the ground potential and the NPN bipolar transistor 59 becomes non-conductive.

On the other hand, since the NMOS logic section 52 formed by the NMOSs 57 and 58 becomes conductive and the NMOS 60 becomes non-conductive, the base potential of the NPN bipolar transistor 62 starts rising towards the potential which is lower than the potential of the input signals of $S_1$, $S_2$ of "1" level by the amount of the threshold voltages of the NMOSs 57 and 58. As a result, the NPN bipolar transistor 62 becomes conductive. Then, the potential of the output signal $S_o$ falls towards the potential which is higher by the amount of $V_F$ from the ground potential and reaches its "0" level. The base potential of the NPN bipolarr transistor 62 rises once but, along with the falling of the level of the output signal $S_o$, falls again and eventually becomes the same as the level of the output signal $S_o$.

In the conventional BiCMOS logic circuit shown in FIG. 2, when the potential at the output terminal $T_o$ changes from "0" level to "1" level, the base potential of the NPN bipolar transistor 59 rises up to $(V_{DD}-V_F)$ causing the NPN bipolar transistor 59 to become conductive sufficiently, so that it is possible to charge the potential of the output terminal $T_o$ at a high speed. However, when the potential at the output terminal $T_o$ changes from "1" level to "0" level, the base potential of the NPN bipolar transistor 62 does not rise beyond the potential which is lower by the amount of the threshold voltages of the NMOSs than the "1" level potential of the input signals $S_1$, $S_2$, the base potential of the NPN bipolar transistor 62 in the case of the input terminals being connected to outputs of other BiCMOS logic circuits rises only up to $(V_{DD}-V_F-V_{TN})$ (wherein $V_{TN}$ is the threshold voltage of the NMOSs).

The lowering of the ability to charge the transistor 62 as above is more remarkable when the power source voltage $V_{DD}$ is low. Thus, as shown by a curve A in FIG. 7, the average delay time Tpd in the BiCMOS logic circuit is shown to have characteristics that it increases very rapidly when the power source voltage $V_{DD}$ is in the order of 3 V.

Therefore, although the conventional BiCMOS logic circuit can operate at a high speed if the voltage is 5 V which is a conventional standard voltage, the operation speed suddenly deteriorates at a power source voltage in the order of 3 V. Thus, as the power source voltage is lowered as necessitated by advancement in elements being made smaller and more compact, the advantage in the BiCMOS logic circuit over the CMOS logic circuit, that is, the advantage in the capability of driving a large load capacitance at a high speed, is lost and this means that such an advantage or superiority over the CMOS logic circuit can no longer be maintained if the standard power source voltage were to be 3.3 V which is aimed at as a possible standard power source voltage in the future.

In order to overcome the above problems, the present invention provides a BiCMOS which is capable of operating at a high speed under a low power source voltage.

According to the present embodiment, the NMOSs constituting the CMOS logic circuit becomes conductive and, when the output of the CMOS logic circuit rises, the base of the second NPN bipolar transistor is charged by both the NMOS logic section and the PMOS connected thereto in parallel. Therefore, the base potential of the second NPN bipolar transistor is charged to a level higher than in a conventional circuit. This means that the circuit according to the present invention can operate at a higher speed under a lower power source voltage.

Now, some preferred embodiments according to the above aspect of the invention will be explained.

Figure 6:
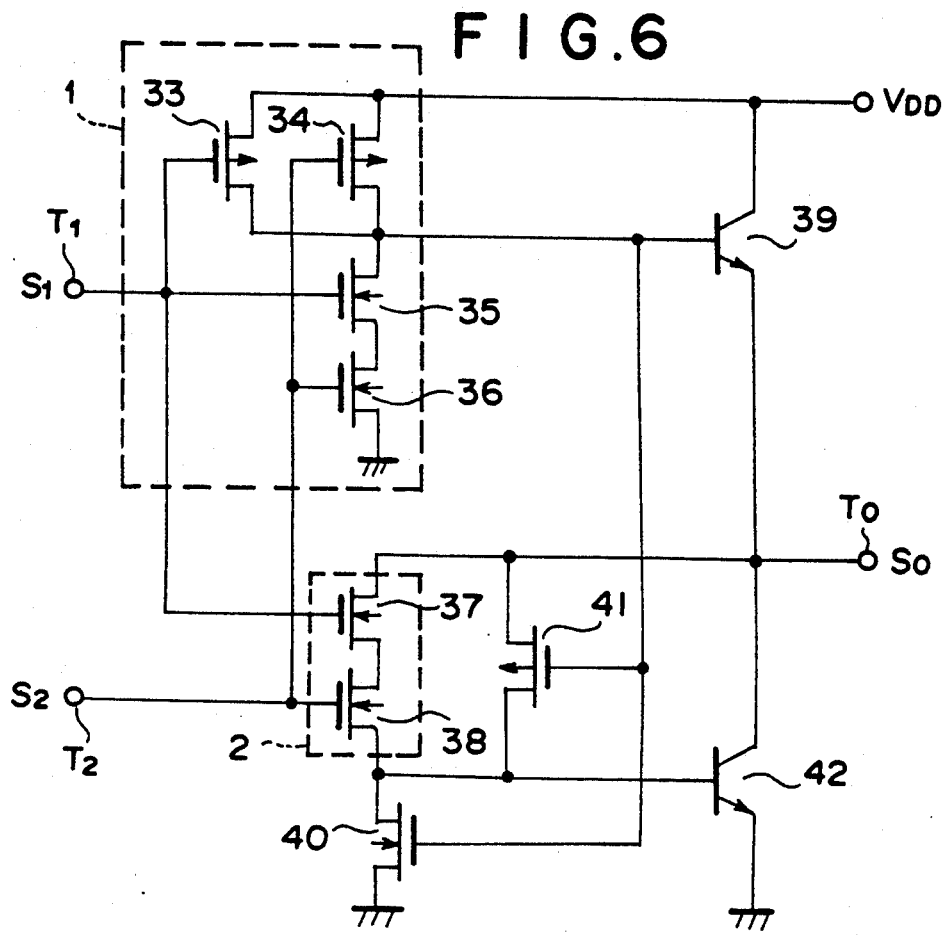
FIG. 6 is a circuit diagram showing a BiCMOS logic circuit of a third embodiment according to the present invention.

FIG. 6 diagrammatically shows a two-input NAND type BiCMOS logic circuit which is designed the operation under low power supply voltage and which includes a first NPN bipolar transistor and a second NPN bipolar transistor connected with each other in series.

A CMOS logic circuit 1 is one from which a logical NAND signal between input signals $S_1$ and $S_2$ is outputted and in which a parallel circuit of a pair of PMOSs 33, 34 and a serial circuit of NMOSs 35, 36 are connected in series between a power source terminal $V_{DD}$ and a ground terminal. The input signal $S_1$ is inputted to gates of the PMOS 33 and the NMOS 35 and the input signal $S_2$ is inputted to gates of the PMOS 34 and the NMOS 36. A connection node between common drains of the PMOSs 33, 34 and a drain of the NMOS 35 is an output node of the CMOS logic circuit 1.

The output node of the CMOS logic circuit 1 is connnected to a base of an NPN bipolar transistor 39. The NPN bipolar transistor 39 has its collector connected to the power source terminal $V_{DD}$ and its emitter connected to an output terminal $T_o$ for outputting an output signal $S_o$. An NPN bipolar transistor 42 is connected betweeen the emitter of the NPN bipolar transistor 39 and the ground terminal.

Between the output terminal $T_o$ and the base of the NPN transistor 42, there are a NMOS logic section 2 formed by NMOSs 37, 38 and a PMOS 41 connected thereto in parallel. The input signals $S_1$ and $S_2$ are respectively inputted to the gates of the NMOSs 37 and 38. The gate of the PMOS 41 is connected to the base of the NPN bipolar transistor 39. Further, an NMOS 40 is connected between the base of the NPN bipolar transistor 42 and the ground terminal. The gate of the NMOS 40 is connected to the base of the NPN bipolar transistor 39.

The NMOS logic section 2 and the NMOS 40 constitute a partial circuit of the two-input AND logic circuit. There occurs a push-pull operation between the NPN bipolar transistor 39 whose base is connected to the output node of the CMOS logic circuit 1 and the NPN bipolar transistor 42 whose base is connected to the output node of the partial circuit constituted by the NMOS logic section 2 and the NMOS 40. The PMOS 41 serves to enhance the charging capability when the base potential of the NPN bipolar transistor 42 is to be charged up to the $V_{DD}$ potential.

Now, the operation of the circuit described above is explained with reference to FIG. 6.

In the state wherein both the input signals $S_1$ and $S_2$ are "1", the PMOSs 33 and 34 are non-conductive and the NMOSs 35 and 36 are conductive so that the output node of the CMOS logic circuit 1 becomes "0" level. Accordingly, the drain of the NMOS 40 becomes "1" level and the NPN bipolar transistors 39 and 42 become respectively non-conductive and conductive. Consequently, the output signal $S_o$ becomes "0" level. When this state changes to a state wherein at least either of the input signals $S_1$ and $S_2$ changes to "0" level, at least one of the PMOSs 33 and 34 becomes conductive and at least one of the NMOS 35 and 36 becomes non-conductive, so that the potential at the output node of the CMOS logic circuit 1, that is, the potential of each of the base of the NPN bipolar transistor 39, the gate of the PMOS 41 and the gate of the NMOS 40, rises towards the potential of the power source voltage $V_{DD}$. Here, since at least one of the NMOS 37 and 38 constituting the NMOS logic section 2 becomes non-conductive so that the base potential of the NPN bipolar transistor 42 falls towards the ground potential. Consequently, the NPN bipolar transistor 39 becomes conductive and the NPN bipolar transistor 42 becomes non-conductive, so that the potential of the output terminal $T_o$ rises to $(V_{DD}-V_F)$ whereby an output of "1" level is outputted.

In contrast to the above, when the state wherein either of the input signals $S_1$ and $S_2$ is "0" changes to a state wherein both the input signals are "1", the potential of the output node of the CMOS logic circuit 1, that is the potential of each of the base of the NPN bipolar transistor 39, the gate of the PMOS 41 and the gate of the NMOS 40, falls towards the ground potential and the NPN bipolar transistor 39 and the NMOS 40 become non-conductive. On the other hand, since both the NMOSs 37 and 38 become conductive, the base potential of the NPN bipolar transistor 42 starts rising. Also, accompanying the lowering of the potential of the output node of the CMOS logic circuit 1, the NMOS 40 changes to its non-conductive state and, since the PMOS 41 changes to its conductive state, the base of the NPN bipolar transistor 42 is charged both by the NMOS logic section 2 and the PMOS 41 causing the base potential to rise rapidly to $(V_{DD}-V_F)$. As a consequence, the NPN bipolar transistor 42 becomes conductive and the potential of the output terminal $T_o$ eventually falls to a voltage which is higher by the amount of $V_F$ than the ground potential.

As explained above, according to the present embodiment of the invention, when both the input signals $S_1$ and $S_2$ undergo changes, the base potential of the NPN bipolar transistor 42 is enabled to be charged up to a potential higher than that in the conventional circuit of FIG. 2. Thus, the circuit according to the invention can operate at a high speed under low power source voltage.

Further, by setting the threshold voltage $V_{TP}$ of the PMOS 41 in the order of 0 V, it is possible to speed up the charging to the base of the NPN bipolar transistor 42 through the PMOS 41 thereby improving the operation speed of the circuit. Even if the threshold voltage of the PMOS 41 is in the order of 0 V, as to the leakage current when the output terminal $T_o$ is of "1" level", since the potential at the source of the PMOS 41 is $(V_{DD}-V_F)$ and the potential at the gate thereof is $V_{DD}$, the positive voltage in the amount of $V_F$ is applied between the gate and the source thereof, so that the PMOS 41 is non-conductive and the leakage current can be kept sufficiently small.

Figure 7:
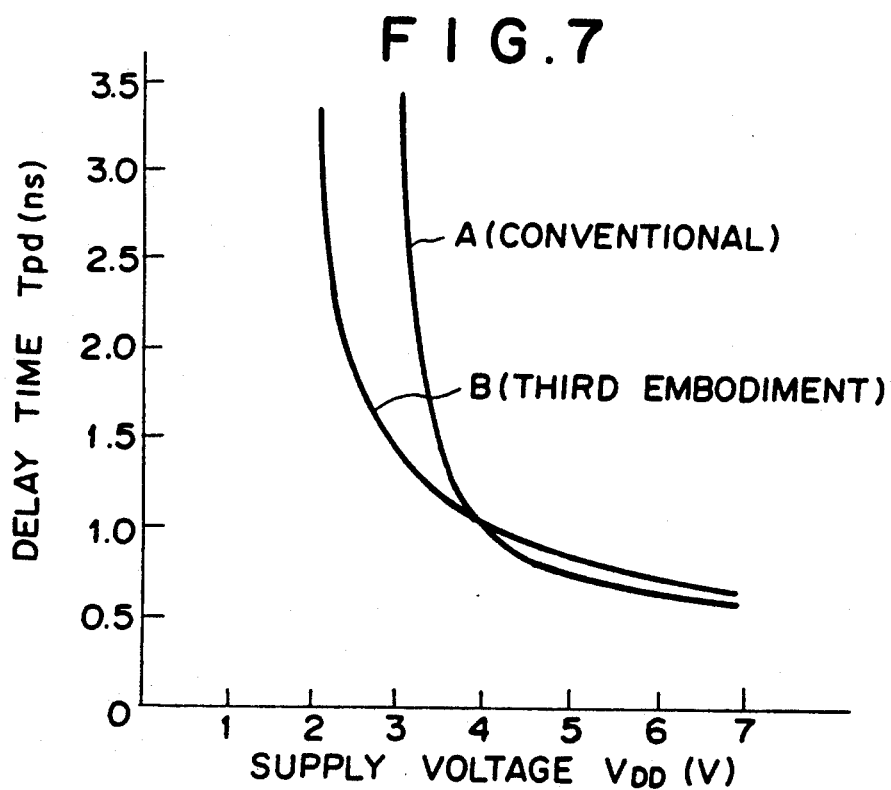
FIG. 7 is a graph showing a delay time dependency on power supply voltage in the circuit of FIG. 6 and that in the prior art.

FIG. 7 graphically shows a delay time dependency on the power supply voltages of the circuit according to the present embodiment. As apparent from the graph, the curve B representing the characteristics of this embodiment shows an expansion in the operative range of power supply voltage to the direction of a voltage lower by approximately $V_{TN}$ as compared with the curve B for the corresponding characteristics of the conventional circuit concerned.

A fourth embodiment of the present invention will be explained with reference to FIG. 8.

The difference between the fourth embodiment and the third embodiment explained above is that the gate of the NMOS 40 is not connected to the output node of the CMOS logic circuit 1 but is connected to the output terminal $T_o$ for the output singal $S_o$. The arrangements in other respects are the same as those in the third embodiment of the circuit shown in FIG. 6.

Figure 8:
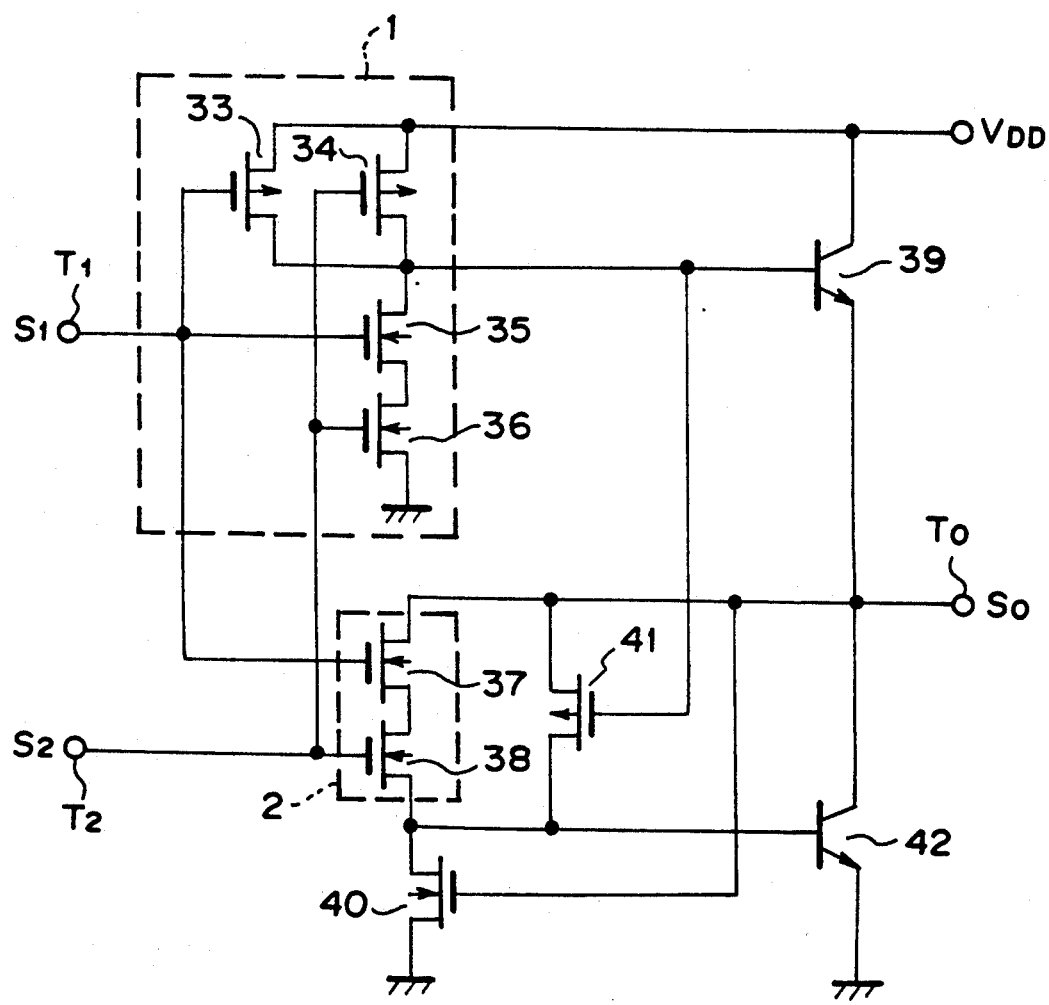
FIG. 8 is a circuit diagram showing a BiCMOS logic circuit of a fourth embodiment according to the present invention.

In the embodiment of FIG. 8, the loads to be driven by the CMOS logic circuit 1 are only the base of the NPN bipolar transistor 39 and the gate of the PMOS 41 so that, as compared with the third embodiment, the operation speed of the CMOS logic circuit 1 is higher thereby allowing the overall circuit to operate at a high speed. Further, if the threshold voltge of the PMOS 41 is set to a value in the order of 0 V, the advantage is more effective as is the case with the third embodiment.

Figure 9:
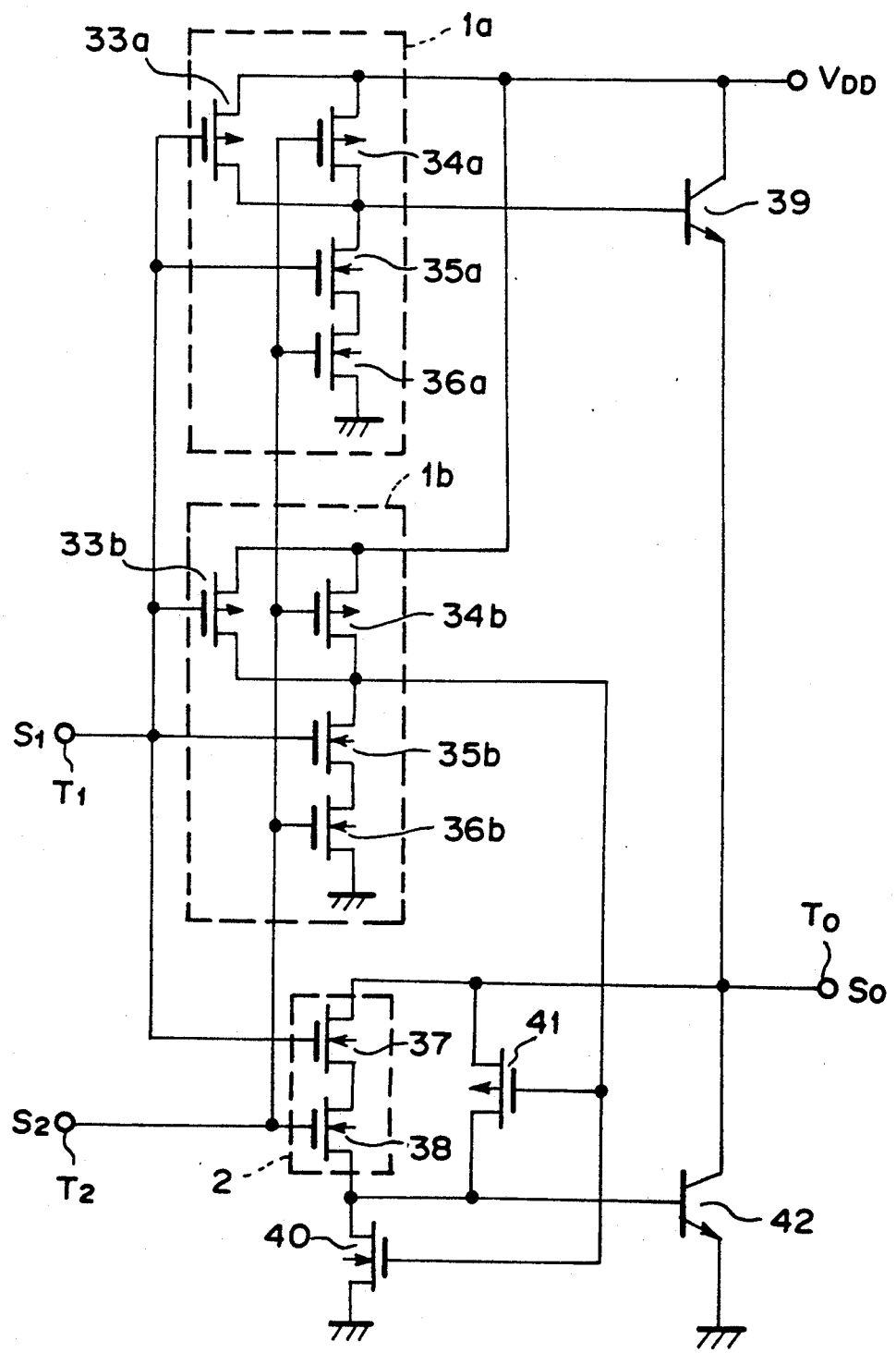
FIG. 9 is a circuit diagram showing a BiCMOS logic circuit of a fifth embodiment according to the present invention.

FIG. 9 diagrammatically shows a BiCMOS logic circuit of a fifth embodiment according to the present invention.

The circuit shown in FIG. 9 includes a first CMOS logic circuit 1a formed by a pair of PMOSs 33a, 34a and a pair of NMOSs 35a, 36a and a second CMOS circuit 1b formed by a pair of PMOSs 33b, 34b and a pair of NMOSs 35b, 36b. These logic circuits 1a and 1b have the same configuration, each with the two-input NAND type circuit.

The difference between this embodiment and the third embodiment described above is that the NPN bipolar transistor 39, the NMOS 40 and the PMOS 41 are all driven by the CMOS logic circuit 1 in the third embodiment, and the first CMOS logic circuit 1a is provided exclusively for driving the base of the NPN bipolar transistor 39 and the second CMOS logic circuit 1b is exclusively for driving the gates of the NMOS 40 and the PMOS 41 in the fifth embodiment of FIG. 9. The arrangements and operation in other respects are the same as in the third embodiment shown in FIG. 6.

According to the embodiment of FIG. 9, the output load capacitance to be driven by the first CMOS logic circuit 1a is only the base capacitance of the NPN bipolar transistor 39 and also the output load capacitance to be driven by the second CMOS logic circuit 1b is only the gate capacitances of the NMOS 40 and the PMOS 41, which can improve speeds of the CMOS logic circuits 1a, 1b thereby enabling the entire circuit to operate at a high speed and enabling the design of MOS circuits to be given more freedom.

It is also true in this the embodiment of FIG. 9, as in the embodiments explained above, that the effect of speeding up is higher if the threshold voltage of the PMOS 41 is set to a value in the order of 0 V.

Figure 10:
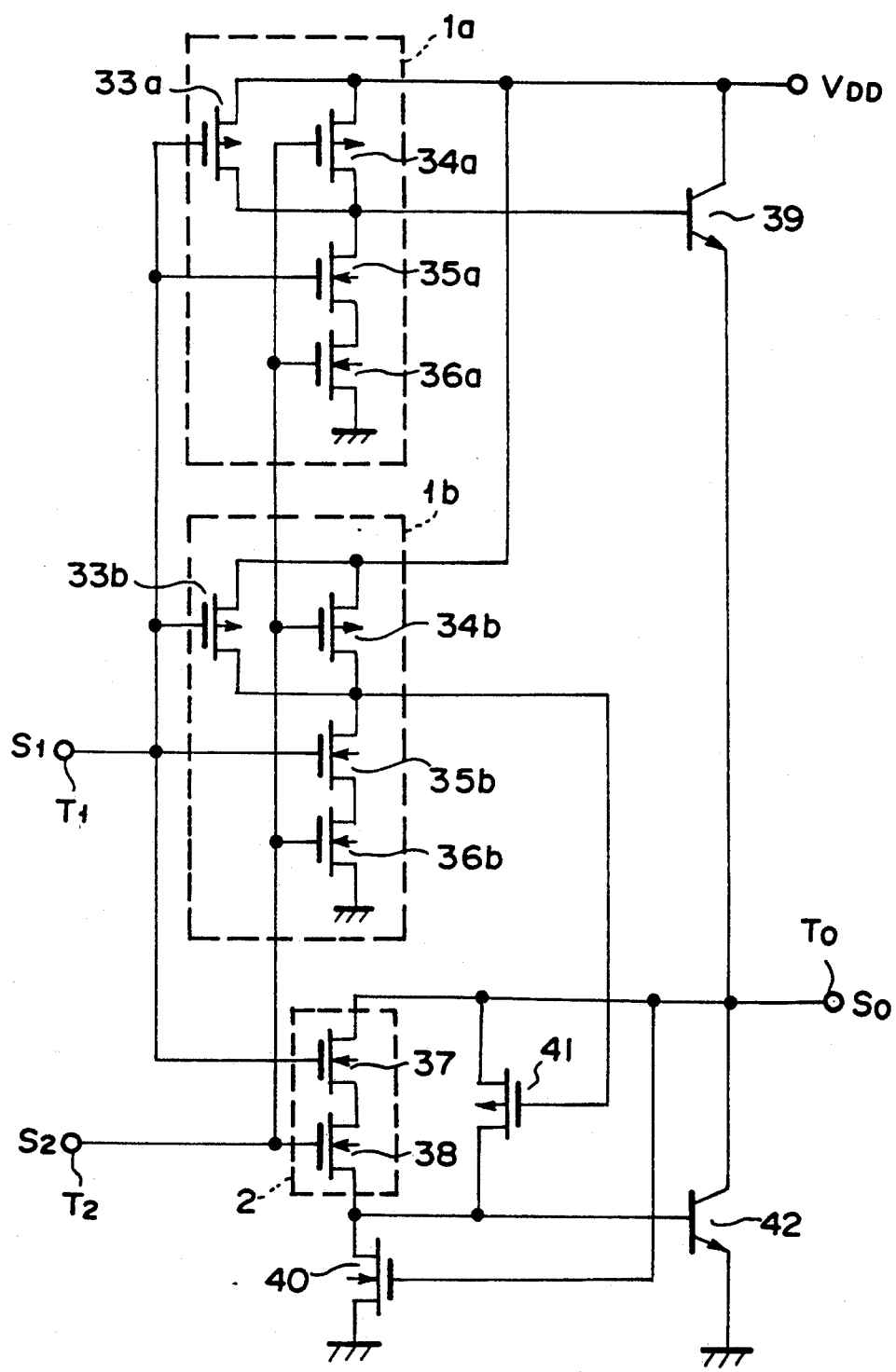
FIG. 10 is a circuit diagram showing a BiCMOS logic circuit of a sixth embodiment according to the present invention.

A sixth embodiment of the present invention is shown in FIG. 10.

The difference between the sixth embodiment and the fifth embodiment of FIG. 9 is that the gate of the NMOS 40 is connected to the output terminal $T_o$ for the output signal $S_o$. The arrangements of the circuit of FIG. 10 in other rspects are the same as those in the fifth embodiment shown in FIG. 9.

For the above embodiments, the explanation has been made only with respect to the two-input NAND circuits. However, it is of course possible for the present invention to be embodied in other types of logic circuits including those of NOR types.

As explained above, in the above embodiments, since the base of the second NPN bipolar transistor is charged by both the NMOS logic section and the PMOS connected thereto in parallel, it is possible to charge the second NPN bipolar transistor to a base potential higher than that in the conventional circuit explained. Therefore, the present invention can provide a BiCMOS circuit which is capable of operating at a high speed even under a low power supply voltage in the order of 3.3 V.

While the invention has been described in its preferred embodiments, it is to be understood that the words which have been used are words of description rather than limitation and that changes within the purview of the appended claims may be made without departing from the true scope and spirit of the invention in its broader aspects.

I claim:

1. A BiCMOS logic circuit comprising:
   a higher potential and a lower potential power supply terminal ($V_{DD}$, GND);
   a CMOS logic circuit (1) for conducting a logical operation on input signals ($S_1$, $S_2$) applied thereto and including N-channel MOSFETs (5, 6) receiving said input signals;
   and NPN bipolar transistor (9) having a base connected to said CMOS logic circuit, a collector connected to said higher potential power supply terminal and an emitter connected to an output terminal ($T_o$), said NPN bipolar transistor being driven by an output signal from said CMOS logic circuit;
   a first N-channel MOSFET (12) having a drain connected to said output terminal and a source connected to said lower potential power supply terminal;
   an N-channel MOS logic section (2) connected between said higher potential power supply terminal and a gate of said first N-channel MOSFET (12) and having the same circuit configuration and receiving the same input signals as said N-channel MOSFETs (5, 6) of said CMOS logic circuit;
   a P-channel MOSFET (11) connected in parallel with said N-channel MOS logic section and receiving at its gate said output signal from said CMOS logic circuit; and
   a second N-channel MOSFET (10) connected between the gate of said first N-channel MOSFET and said lower potential power supply terminal and receiving at its gate said output signal from said CMOS logic circuit.

2. A BiCMOS logic circuit comprising:
   a higher potential and a lower potential power supply terminal ($V_{DD}$, GND);
   a first CMOS logic circuit (1a) for conducting a logical operation on input signals ($S_1$, $S_2$) applied thereto and including N-channel MOSFETs (5a, 6a) receiving said input signals;
   a second CMOS logic circuit (1b) having the same circuit configuration as said first CMOS logic circuit for conducting the same logical operation on said input signals applied thereto, said second CMOS logic circuit (1a) including N-channel MOSFETs (5b, 6b) receiving said input signals;
   an NPN bipolar transistor (9) having a base connected to said first CMOS logic circuit, a collector connected to said higher potential power supply terminal and an emitter connected to an output terminal ($T_o$), said NPN bipolar transistor being driven by an output signal from said first CMOS logic circuit;
   a first N-channel MOSFET (12) having a drain connected to said output terminal and a source connected to said lower potential power supply terminal;
   an N-channel MOS logic section (2) connected between said higher potential power supply terminal and a gate of said first N-channel MOSFET and having the same circuit configuration and receiving the same input signals as said N-channel MOSFETs (5a, 6a; 5b, 6b) of said first and second CMOS logic circuits;
   a P-channel MOSFET (11) connected in parallel with said N-channel MOS logic section and receiving at its gate an output signal from said second CMOS logic circuit; and
   a second N-channel MOSFET (10) connected between the gate of said first N-channel MOSFET and said lower potential power supply terminal and receiving at its gate said output signal from said second CMOS logic circuit.

3. A BiCMOS logic circuit comprising:
   a higher potential and a lower potential power supply terminal ($V_{DD}$, GND);
   a first CMOS logic circuit (1a) for conducting a logical operation on input signals ($S_1$, $S_2$) applied thereto and including N-channel MOSFETs (35a, 36a);
   a second CMOS logic circuit (1b) having the same circuit configuration as said first CMOS logic circuit for conducting the same logical operation on said input signals applied thereto, said second CMOS logic circuit (1b) including N-channel MOSFETs (35b, 35b) receiving said input signals;
   a first NPN bipolar transistor (39) having a base connected to said first CMOS logic circuit, a collector connected to said higher potential power supply terminal and an emitter connected to an output terminal ($T_o$), said first NPN bipolar transistor being driven by an output signal from said first CMOS logic circuit;
   a second NPN bipolar transistor (42) having a collector connected to said output terminal and an emitter connected to said lower potential power supply terminal;
   an N-channel MOS logic section (2) connected between said output terminal and a base of said second NPN bipolar transistor and having the same circuit configuration and receiving the same input signals as said N-channel MOSFETs (35a, 36a; 35b, 36b) of said first and second CMOS logic circuits;
   a P-channel MOSFET (41) connected in parallel with said N-channel MOS logic section and receiving at its gate an output signal from said second CMOS logic circuit; and
   an N-channel MOSFET (40) connected between the base of said second NPN bipolar transistor and said lower potential power supply terminal and receiving at its gate said output signal from said second CMOS logic circuit.

4. A BiCMOS logic circuit comprising:
   a higher potential and a lower potential power supply terminal ($V_{DD}$, GND);
   a first CMOS logic circuit (1a) for conducting a logical operation on input signals ($S_1$, $S_2$) applied thereto and including N-channel MOSFETs (35a, 36a) receiving said input signals;
   a second CMOS logic circuit (1b) having the same circuit configuration as said first CMOS logic circuit for conducting the same logical operation on said input signals applied thereto, said second CMOS logic circuit (1b) including N-channel MOSFETs receiving said input signals;
   a first NPN bipolar transistor (39) having a base connected to said first CMOS logic circuits, a collector connected to said higher potential power supply terminal and an emitter connected to an output terminal ($T_o$), said first NPN bipolar transistor being driven by an output signal from said first CMOS logic circuit;

a second NPN bipolar transistor (42) having a collector connected to said output terminal and an emitter connected to said lower potential power supply terminal;

an N-channel MOS logic section (2) connected between said output terminal and a base of said second NPN bipolar transistor and having the same circuit configuration and receiving the same input signals as said N-channel MOSFETs (35a, 36a; 35b, 36b) of said first and second CMOS logic circuits;

a P-channel MOSFET (41) connected in parallel with said N-channel MOS logic section and receiving at its gate an output signal from said second CMOS logic circuit; and an N-channel MOSFET (40) connected between the base of said second NPN bipolar transistor and said lower potential power supply terminal and having its gate connected to said output terminal.

* * * * *